(12) United States Patent
Nishimura et al.

(10) Patent No.: US 7,859,083 B2
(45) Date of Patent: Dec. 28, 2010

(54) SEMICONDUCTOR DEVICE

(75) Inventors: Takeyoshi Nishimura, Matsumoto (JP);
Takashi Kobayashi, Matsumoto (JP);
Yasushi Niimura, Matsumoto (JP);
Tadanori Yamada, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 135 days.

(21) Appl. No.: 12/188,627

(22) Filed: Aug. 8, 2008

(65) Prior Publication Data
US 2009/0039432 A1 Feb. 12, 2009

(30) Foreign Application Priority Data
Aug. 9, 2007 (JP) ............................. 2007-207562

(51) Int. Cl.
*H01L 29/861* (2006.01)
*H03K 17/74* (2006.01)

(52) U.S. Cl. ............................. 257/603; 257/E27.016

(58) Field of Classification Search ................ 257/362, 257/360, 137, 329, 551, 603, 175, 199; 363/49, 363/80, 21.16; 327/194, 326, 421
See application file for complete search history.

(56) References Cited

U.S. PATENT DOCUMENTS

| | | | |
|---|---|---|---|
| 5,079,608 A * | 1/1992 | Wodarczyk et al. | 257/355 |
| 6,229,180 B1 * | 5/2001 | Yoshida et al. | 257/355 |
| 6,580,121 B2 * | 6/2003 | Hisamoto | 257/328 |
| 2006/0246650 A1 * | 11/2006 | Williams et al. | 438/212 |

FOREIGN PATENT DOCUMENTS

| | | |
|---|---|---|
| JP | 10-321857 A | 12/1998 |
| JP | 2000-294778 A | 10/2000 |
| JP | 2001-257349 A | 9/2001 |
| JP | 2006-093505 A | 4/2006 |

OTHER PUBLICATIONS

Collins English Dictionary, HarperCollins Publisher 2000, Gate—9. The electrode region or regions in a field-effect transistor that is biased to control the conductivity of the channel between the source and drain See on http://www.xreferplus.com/entry/hcengdict/gate_1.*

* cited by examiner

*Primary Examiner*—Thomas L Dickey
*Assistant Examiner*—Nikolay Yushin
(74) *Attorney, Agent, or Firm*—Rossi, Kimms & McDowell LLP

(57) ABSTRACT

A semiconductor device is provided with Zener diodes which are formed by using a polysilicon gate layer(s) so as to be connected to each other in parallel. Parallel-connected rectangular Zener diodes are formed outside an active region or parallel-connected striped Zener diodes are formed inside the active region. The Zener diodes increase the ESD capability of the semiconductor device.

13 Claims, 9 Drawing Sheets

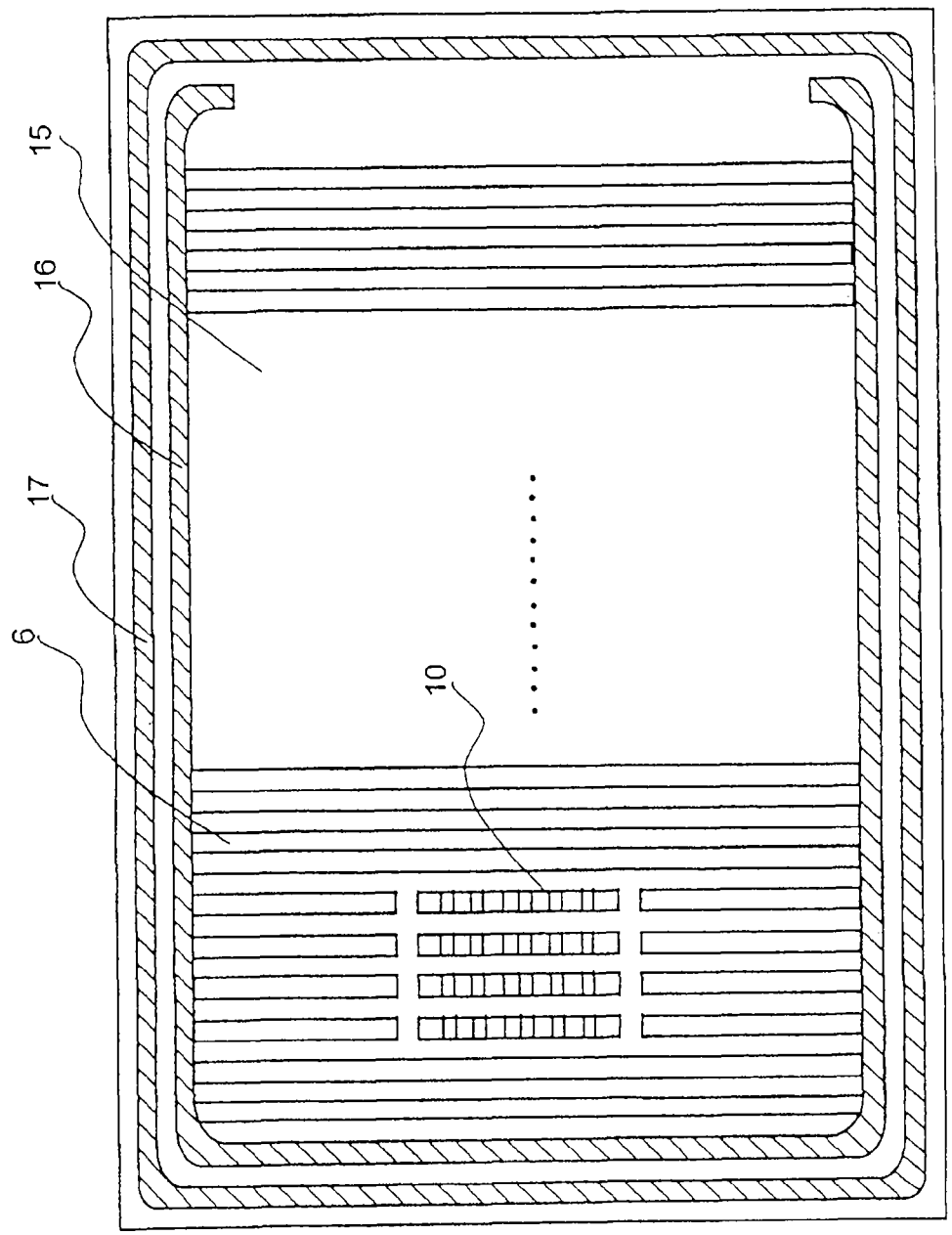
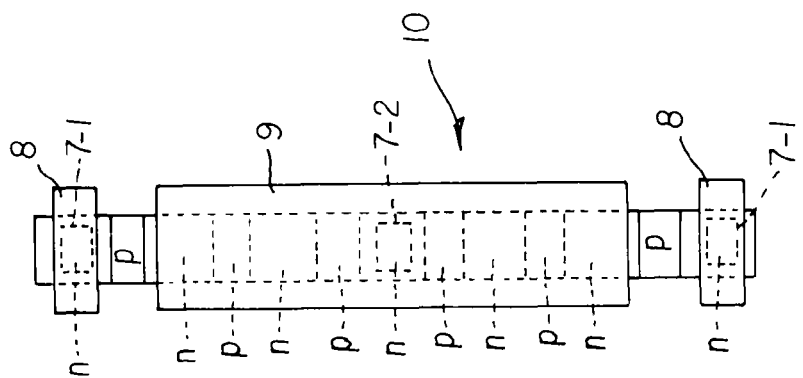
FIG. 3A
FIG. 3B

SEMICONDUCTOR DEVICE

BACKGROUND

The present invention relates to a MOS semiconductor device such as a MOSFET (insulated-gate field-effect transistor) or an IGBT (insulated-gate bipolar transistor) having a polysilicon gate electrode and a bipolar semiconductor device using such a gate electrode material such as polysilicon in which a bidirectional Zener diode for protecting the semiconductor device from an overvoltage that is higher than a prescribed voltage is formed between the gate electrode and a main electrode by utilizing a polysilicon layer. The term "bidirectional" is equivalent to "bidirectional blocking" (the same applies to the following description).

Conventionally, in MOSFETs having a polysilicon gate electrode, a protection diode such as a bidirectional Zener diode is inserted between the gate and source or between the gate and drain as a measure to prevent electrostatic breakdown of the gate insulating film. This protection diode may be formed in a peripheral portion of an active region or along the outer circumference of a gate electrode pad as in a conventional MOS semiconductor device having a protection diode shown in FIGS. 7A-7D and FIG. 8. There is a problem that if the area of the Zener diode is increased to increase the electrostatic discharge capability (ESD capability), the area of the active region which relates to the main current capacity is decreased and the on-resistance is thereby increased.

A description will be made of the conventional MOS semiconductor device having a protection diode that is shown in FIGS. 7A-7D and FIG. 8. FIG. 7A is a plan view of the MOS semiconductor device (chip) having a protection diode. Symbol S denotes a source metal electrode 8 or a terminal and symbol G denotes a gate metal electrode pad 9 or a terminal. FIG. 7B is an enlarged plan view of a portion enclosed by a broken-line frame a in FIG. 7A and including the gate metal electrode pad 9. In FIG. 7B, a ring-shaped Zener diode region 10 is seen through the overlaying layers. FIG. 7C is an enlarged plan view of a portion enclosed by a broken-line frame b in FIG. 7B and shows pn junctions constituting a Zener diode, contact holes 7-1 and 7-2 through which connection is made to the source and the gate, respectively, of the MOS semiconductor device, and an interlayer insulating film 7 which isolates the source metal electrode 8 (seethrough) from the gate metal electrode pad 9 (seethrough). FIG. 7D shows an equivalent circuit of the MOS semiconductor device having a protection diode shown in FIG. 7A. FIG. 8 is an enlarged sectional view taken along line K-K' in FIG. 7B.

In this MOS semiconductor device having a protection diode, as shown in FIG. 8, p-wells 2 are formed selectively in a drift layer 1 (which is a high-resistivity n-type silicon epitaxial layer grown on a low-resistivity n-type silicon substrate 100) adjacent to its surface and a $p^+$ contact region 3 and high-concentration $n^{++}$ source regions 4 are formed selectively in each p-well 2 adjacent to its surface. A gate electrode 6 which is a low-resistivity polysilicon layer is formed on the surface of each portion of the drift layer 1 that is located between $n^{++}$ source regions 4 via a gate insulating film 5 of about 1,000 Å in thickness. The gate electrodes 6 are covered with the interlayer insulating film 7 from above. Unit cells each having a $p^+$ contact region 3, high-concentration $n^{++}$ source regions 4, and a polysilicon gate electrode 6 are formed at a high density adjacent to the surface of the active region which is a main operation region. The polysilicon gate electrodes 6 extend from the respective unit cells and are connected to the gate metal electrode pad 9 together. Openings each of which exposes the surfaces of both of the $n^{++}$ source regions 4 and the $p^+$ contact region 3 of the corresponding unit cell are formed through the interlayer insulating film 7. Contact is made to the source metal electrode 8 through these openings. The Zener diode 10 in which multi-stage pn junctions are formed in series is formed in a polysilicon layer under the source metal electrode 8 and the gate metal electrode pad 9 with the interlayer insulating film 7 interposed in between. Only the portion of the interlayer insulating film 7 that insulation-isolates the source metal electrode 8 from the gate metal electrode pad 9 and is seen between them in the enlarged plan view of FIG. 7B is hatched in FIG. 7B. The rectangular-ring-shaped region in FIG. 7B is the Zener diode 10 as seen through the overlaying layers. As shown in FIG. 7C, in the Zener diode 10, openings 7-1 and 7-2 are formed through the interlayer insulating film 7 so as to obtain a necessary diode breakdown voltage (e.g., several volts to tens of volts) by selecting the number of stages of pn junctions properly. Contact to the source metal electrode 8 is made through the source-side opening 7-1 and contact to the gate metal electrode pad 9 is made through the gate-side opening 7-2, whereby the Zener diode 10 is connected between the gate and the source of the MOS semiconductor device.

With this configuration, when a voltage that is higher than the diode breakdown voltage that is set as described above is applied to the Zener diode 10, the Zener diode 10 breaks down and thereby prevents an event that a voltage higher than the diode breakdown voltage is applied to the gate. Electrostatic breakdown of the gate insulating film 5 is thus prevented. To prevent breakdown (thermal destruction) of the Zener diode 10 itself, the pn junctions of the Zener diode 10 should have a sufficient area.

As described above, the protection Zener diode that is inserted between the gate and the source of a conventional semiconductor device to prevent electrostatic breakdown of the gate insulating film is a single Zener diode formed in an outer peripheral portion of the active region as a main operation region or along the outer circumference of the gate electrode pad to increase its length and thereby increase its junction area or a Zener diode which is bent back and consists of multi-stage pn junctions connected to each other in series to attain a necessary breakdown voltage. When necessary, a Zener diode may be inserted as a clamp diode between the gate and the drain in addition to between the gate and the source.

On the other hand, a MOSFET is well known in which the gate-source electrostatic discharge capability is increased by inserting a gate resistor (JP-A-2006-93505).

JP-A-2001-257349 has a statement to the effect that inserting a resistor or a Zener diode to prevent electrostatic breakdown of a semiconductor device raises a problem of decreasing the area of an effective operation region.

Furthermore, a semiconductor device is known in which Zener diodes for preventing electrostatic breakdown of a semiconductor device are formed in polysilicon layers provided along the outer circumference of an electrode pad and the outer circumference of a chip so that the Zener diodes of each set are connected to each other in series (Japanese Patent No. 3,869,580).

However, where a protection Zener diode is formed along the outer circumference of a gate electrode pad, since the area of the gate electrode pad is much smaller than that of an active region, the circumferential length of the gate electrode pad having an ordinary size cannot increase the diode area beyond a certain limit. If it is intended to further increase the gate-source or gate-drain ESD capability (electrostatic discharge capability) in the case where it is insufficient, it is necessary to increase the area of the gate electrode pad. However, this raises a problem that the area of the active region is decreased relatively and the on-resistance is increased. Where a protection Zener diode whose one end is electrically connected to the source region is formed in an outer peripheral portion of an active region, since the Zener diode and the active region have different surface structures, to give the Zener diode a simple structure the entire outer periphery of the active region needs to be used as the Zener diode. The area of the active region is decreased accordingly and the on-resistance is increased as in the above case.

In view of the above, it would be desirable to provide a semiconductor device capable of increasing the electrostatic discharge capability between the gate electrode and one of the main electrodes while suppressing an increase of the on-resistance.

SUMMARY OF THE INVENTION

The present invention provides a semiconductor device capable of increasing the electrostatic discharge capability between the gate electrode and one of the main electrodes while suppressing increase of the on-resistance.

In one preferred embodiment, a semiconductor device is provided in which an active region as a main operation region, one main electrode film provided on a surface of the active region, and gate electrodes for controlling a main current flowing through the active region are provided on one major surface of a semiconductor substrate. The gate electrodes extend from plural striped gate electrode polysilicon layers provided on surfaces in the active region with an insulating film interposed in between, and are connected together to a gate metal electrode pad that is formed on a surface of a rectangular polysilicon layer provided outside the active region. The other main electrode film is provided on the other major surface of the semiconductor substrate. The semiconductor device includes a rectangular Zener diode formed in the rectangular polysilicon layer in such a manner that p-type layers and n-type layers are formed alternately in multiple stages, wherein the gate metal electrode pad is formed on the rectangular Zener diode with an insulating film interposed in between. One contact region of the rectangular Zener diode is electrically connected to the gate metal electrode pad and the other contact region is electrically connected to the one main electrode film or the other main electrode film.

Plural rectangular multi-stage Zener diodes may be formed in the rectangular polysilicon layer so as to be isolated from each other and connected to each other in parallel.

The semiconductor device may be such that the gate metal electrode pad and the main electrode film are electrically connected to the two contact regions of the rectangular Zener diode through contact holes that are formed selectively through the insulating film, that at least one pair of contact holes corresponding to the two contact regions are separated from each other in a direction parallel with pn junctions, and that the gate metal electrode pad and the main electrode film are isolated from each other between at least the one pair of contact holes.

In another preferred embodiment, a semiconductor device is provided in which an active region as a main operation region, one main electrode film provided on a surface of the active region, and gate electrodes for controlling a main current flowing through the active region are provided on one major surface of a semiconductor substrate. The gate electrodes extend from plural striped gate electrode polysilicon layers provided on surfaces in the active region with an insulating film interposed in between, and are connected together to a gate metal electrode pad that is formed inside the active region so as to be electrically isolated from the active region. The other main electrode film is provided on the other major surface of the semiconductor substrate. The semiconductor device includes plural striped Zener diodes which are formed in plural respective striped polysilicon layers that are electrically isolated from the plural striped gate electrode polysilicon layers and in each of which p-type layers and n-type layers are formed alternately in multiple stages in a direction that crosses a longitudinal direction of the plural striped polysilicon layers and are connected to each other in series. An insulating film which covers surfaces of the striped Zener diodes, wherein one contact region of each of the striped Zener diodes is electrically connected to the common gate metal electrode pad, the other contact region is electrically connected to the one common main electrode film, and the plural striped Zener diodes are connected to each other in parallel.

The gate metal electrode pad may be formed on the surfaces of the plural striped Zener diodes inside the active region with the insulating film interposed in between.

The other contact region of each of the striped Zener diodes may be electrically connected to the other, common main electrode film.

In summary, to increase the ESD capability, a semiconductor device is provided with Zener diodes which are formed by using a polysilicon gate layer(s) so as to be connected to each other in parallel. Parallel-connected rectangular Zener diodes are formed outside an active region or parallel-connected striped Zener diodes are formed inside the active region.

As such, the invention makes it possible to provide a semiconductor device capable of increasing the electrostatic discharge capability (ESD capability) between the gate electrode and one of the main electrodes while suppressing increase of the on-resistance.

BRIEF DESCRIPTION OF THE DRAWINGS

The invention will be described with reference to certain preferred embodiments thereof and the accompanying drawings, wherein:

FIG. 3A is a plan view of a semiconductor device according to a second embodiment of the invention;

FIG. 3B is an enlarged plan view of one Zener diode in an active region;

DETAILED DESCRIPTION OF THE INVENTION

Semiconductor devices according to embodiments of the present invention will be hereinafter described in detail with reference to the drawings. The invention is not limited to the following embodiments, that is, the following embodiments can be modified without departing from the spirit and scope of the invention.

Embodiment 1

Figure 1A:
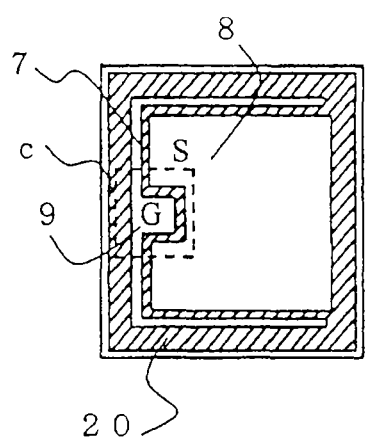
FIG. 1A is a plan view of a semiconductor device according to a first embodiment of the present invention.
Figure 1B:
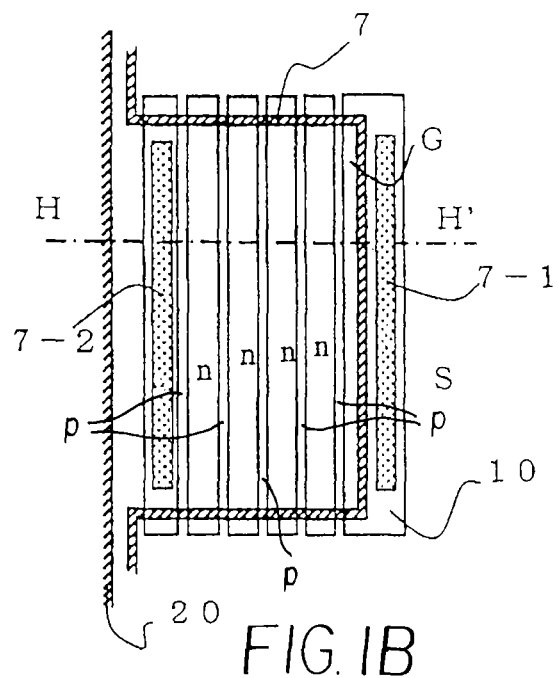
FIGS. 1B-1D are enlarged plan views showing examples of a portion including a gate metal electrode pad.
Figure 1C:
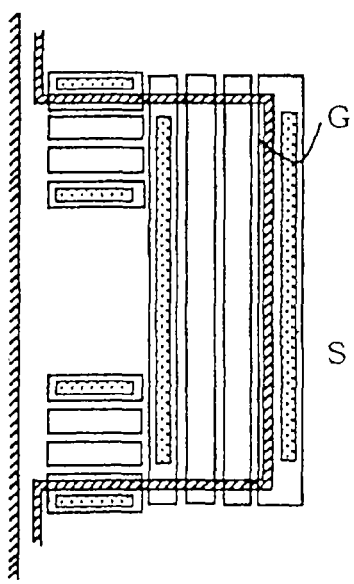
Figure 1D:
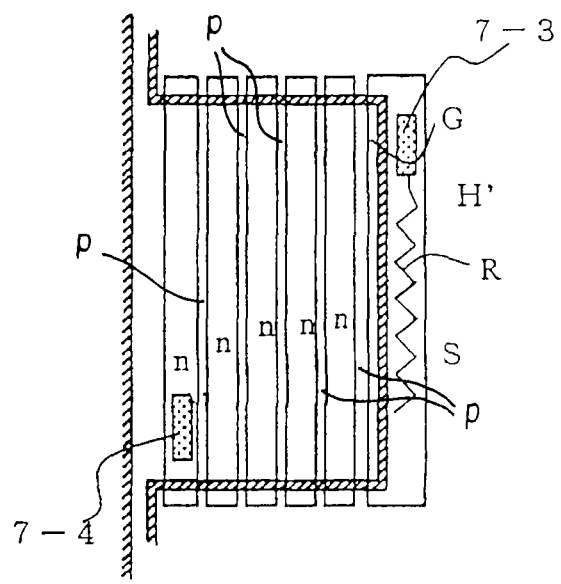
Figure 2:
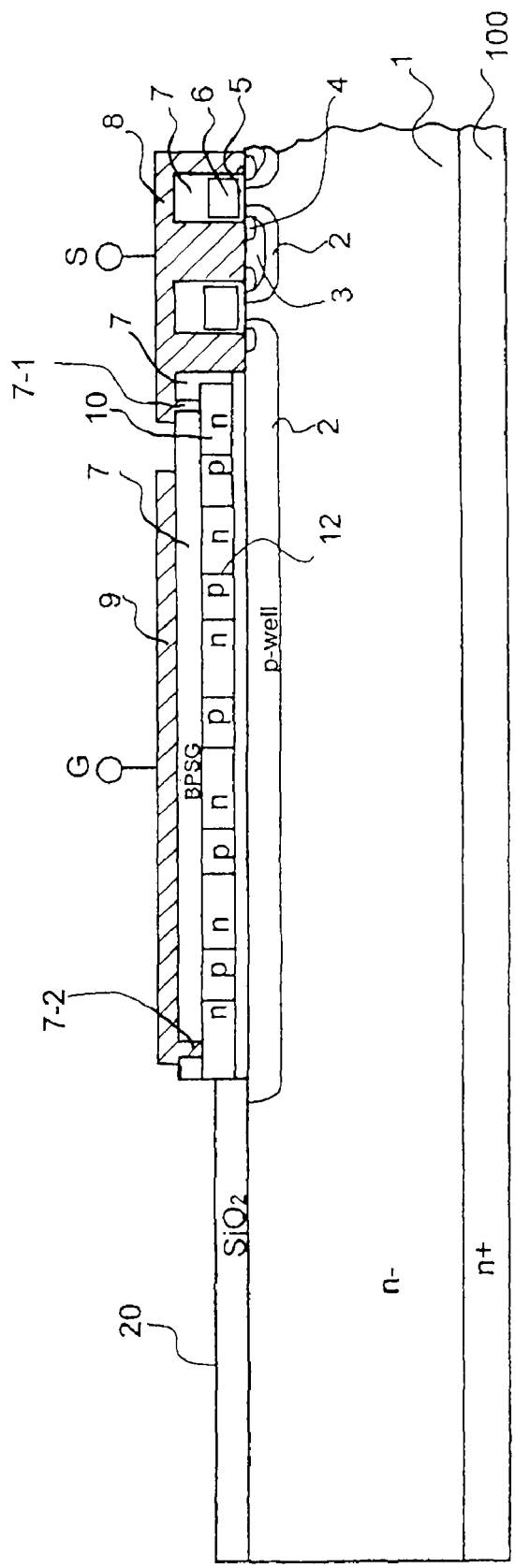
FIG. 2 is an enlarged sectional view taken along line H-H' in FIG. 1B.

FIGS. 1A-1D and FIG. 2 show a MOS semiconductor device according to a first embodiment of the invention in which a Zener diode is inserted between the gate and the source. FIG. 1A is a plan view of the MOS semiconductor device according to the first embodiment. FIG. 1B is an enlarged plan view of a portion enclosed by a broken-line frame c in FIG. 1A and including a gate metal electrode pad 9. In FIGS. 1A-1D and FIG. 2, symbol S denotes a source metal electrode 8 or a source terminal and symbol G denotes the gate metal electrode pad 9 or a gate terminal. A portion of an interlayer insulating film 7 that can be seen from above and serves to insulation-isolate the source metal electrode 8 from the gate metal electrode pad 9 and an insulating film 20 as a protection film of a breakdown-resisting structure formed in the chip periphery are hatched in FIG. 1A. Contact regions 7-1 and 7-2 which are formed at both ends of a Zener diode 10 are dotted in FIG. 1B. FIG. 1C is an enlarged plan view of a portion including a gate metal electrode pad 9 which is provided with Zener diodes that are arranged differently than in FIG. 1B. FIG. 1D is an enlarged plan view showing a Zener diode structure in which a gate resistor utilizing sheet resistance of the Zener diode is connected in series to the Zener diode 10. FIG. 2 is an enlarged sectional view taken along line H-H' in FIG. 1B.

In the example of FIGS. 1B and 2, a multi-stage Zener diode 10 is formed in a rectangular polysilicon layer under the gate metal electrode pad 9 (seethrough in FIG. 1B) with the interlayer insulating film (boro-phospho silicate glass (BPSG) film) 7 interposed in between. The rectangular Zener diode 10 shown in FIG. 1B is a bidirectional Zener diode in which, to obtain an arbitrary Zener voltage, the breakdown voltage is adjusted by the number of stages of pn junctions 12 by selecting the locations of the contact regions 7-1 and 7-2.

The example of FIG. 1C is intended for a case that the Zener diode breakdown voltage is allowed to be lower than in the example of FIG. 1B. The number of stages of pn junctions 12 of the Zener diode is reduced, and plural Zener diodes whose pn junctions 12 are arranged in a different direction than in the original Zener diode are formed in a freed portion of the polysilicon layer. In this case, the ESD capability can be increased further by connecting the additional Zener diodes in parallel with the original Zener diode by metal interconnections. Contact regions, to metal electrodes, formed at the ends of each Zener diode are dotted in FIG. 1C.

The example of FIG. 1D is such that the contact regions 7-1 and 7-2 to the metal electrodes are changed to contact regions 7-3 and 7-4. Forming the contact regions 7-3 and 7-4 at the positions shown in FIG. 1D makes it possible to insert a resistor R in series to the Zener diode, which contributes to increase of the ESD capability. The resistor R utilizes the sheet resistance of a diffusion layer of the Zener diode, and its resistance can be adjusted by changing the distance between the contact regions 7-3 and 7-4.

Embodiment 2

FIGS. 3A and 3B to FIG. 6 show a MOS semiconductor device according to a second embodiment of the invention in which Zener diodes are inserted between the gate and the source. As shown in a plan view of FIG. 3A, in the MOS semiconductor device according to the second embodiment, pn junctions are formed in multiple stages in each of plural polysilicon layers 6 so as to be connected to each other in series, the polysilicon layers 6 having the same stripe pattern as striped polysilicon layers 6 that constitute a cell structure in an active region 15. Plural striped Zener diodes 10 are thus constructed. The plural striped Zener diodes 10 are covered, from above, with a gate metal electrode pad 9 with an interlayer insulating film (BPSG film; not shown in FIG. 3A) interposed in between. A source metal electrode 8 and a gate metal electrode pad 9 are in contact with two respective contact regions of each Zener diode 10. FIG. 3B is an enlarged plan view of one of the striped Zener diodes 10. The gate metal electrode pad 9 is electrically connected to one contact region of the Zener diode 10 via a contact hole 7-2 (indicated by a broken line) which is formed through a BPSG film (not shown). The source metal electrode 8 is electrically connected to the other contact region of the Zener diode 10 via contact 7-1 (indicated by broken lines) which are formed through the BPSG film (not shown). The plural, thin, striped Zener diodes 10 are connected to each other in parallel in such a manner that the source metal electrode 8 and the gate metal electrodes pad 9 are connected, in common, to the contact regions of the Zener diodes 10. In FIG. 3A, reference numeral 16 denotes a metal gate runner which serves to uniformly apply a gate voltage to the plural striped polysilicon gate electrodes of the cell structure in the active region 15. Reference numeral 17 denotes a source runner which is disposed outside the metal gate runner 16 and has a function of a metal field plate for stabilizing the breakdown resistance by reducing the degree of electric field concentration occurring at the time of voltage application when receiving the same potential as the source metal electrode 8 covering the active region 15. It is preferable that the source runner 17 be a metal film made of aluminum or the like and formed on an insulating film which is formed on the surface of a breakdown-resisting structure.

The locations of the contact regions, to the gate metal electrode pads 9, of each striped Zener diode 10 may be selected so as to attain a desired breakdown voltage. For example, in the example of FIG. 3B, the central n-type layer of each striped Zener diode 10 is brought in contact with the gate metal electrode pad 9 and the two end n-type layers are brought in contact with the source metal electrode 8, whereby the plural striped Zener diodes 10 are connected to each other in parallel. To increase the Zener voltage further, the contact region to the gate metal pad 9 may be formed at one end of each striped Zener diode 10 rather than at its center.

Figure 4A:
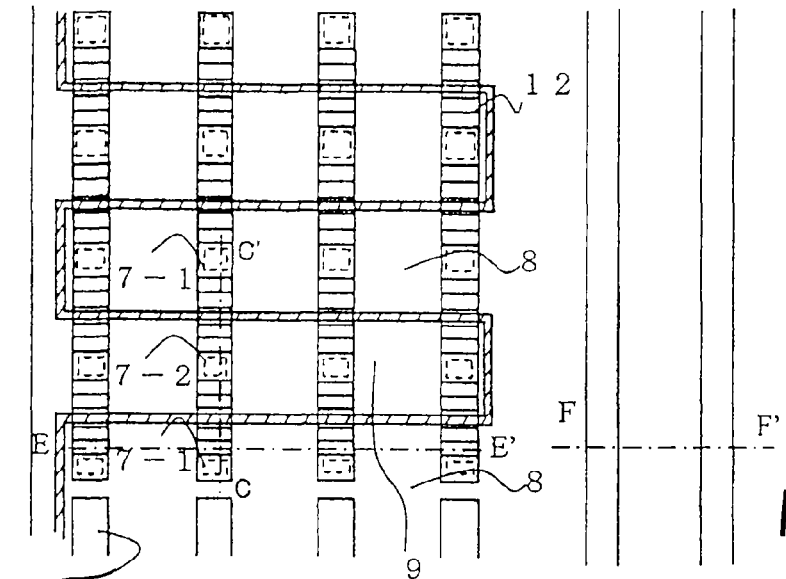
FIGS. 4A and 4B are enlarged plan views showing examples of Zener diodes in the active region of the semiconductor device according to the second embodiment.
Figure 6:
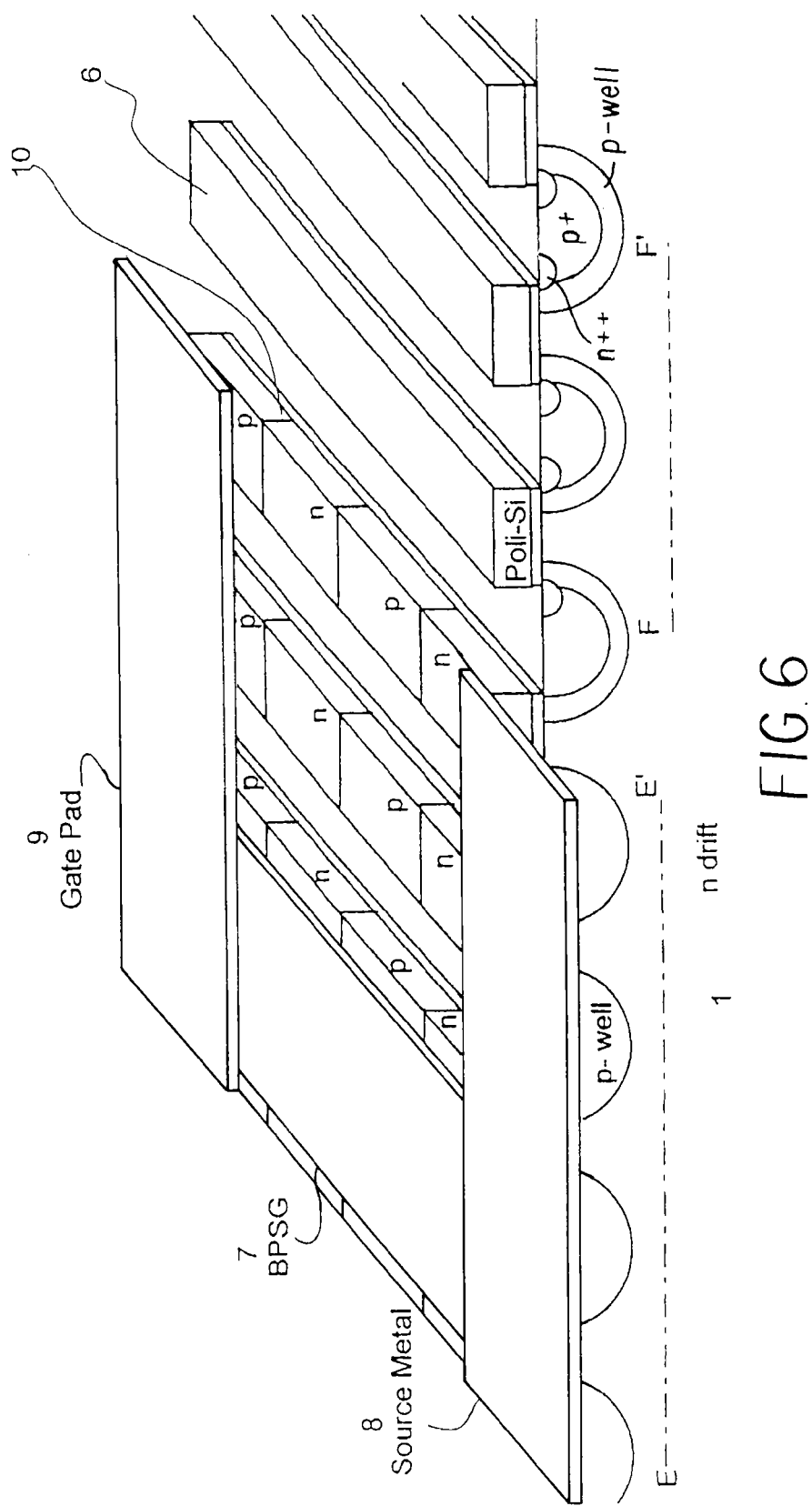
FIG. 6 is a partially sectional perspective view taken along line E-E' and line F-F' in FIG. 4A.
Figure 7A:
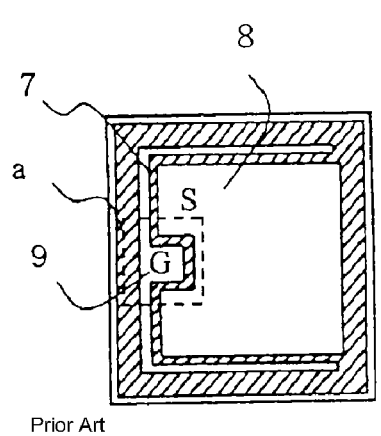
FIG. 7A is a plan view of a conventional semiconductor device.
Figure 7B:
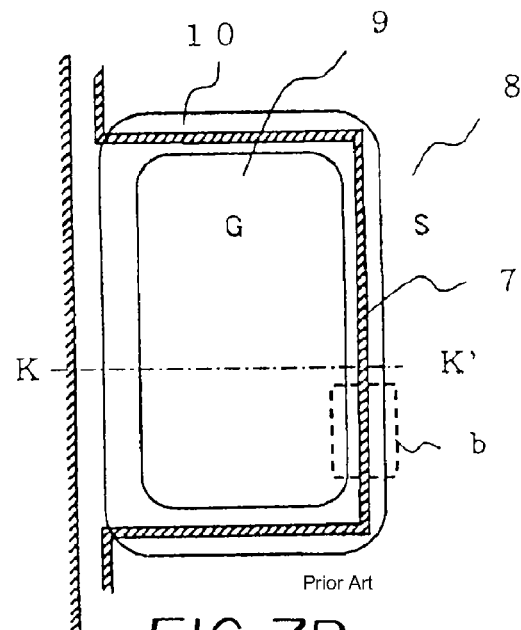
FIG. 7B is an enlarged plan view of a portion including a gate metal electrode pad of the conventional semiconductor device.
Figure 7C:
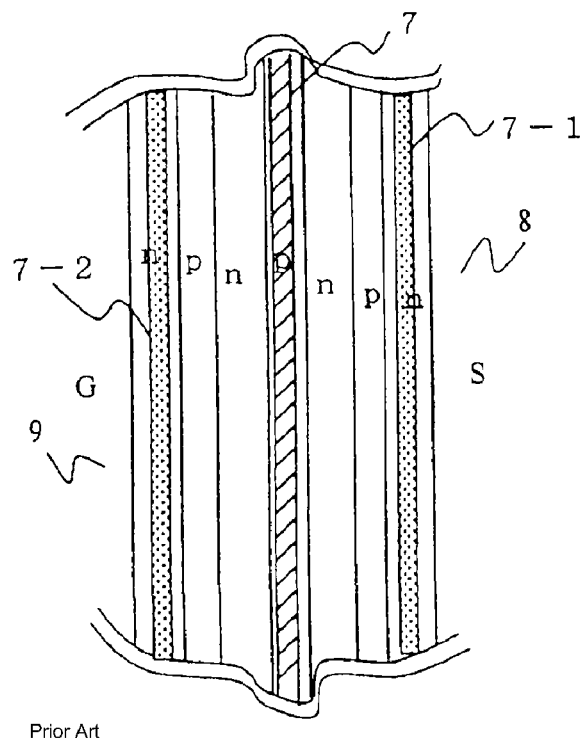
FIG. 7C is an enlarged plan view of a portion enclosed by a broken-line frame in FIG. 7B.
Figure 7D:
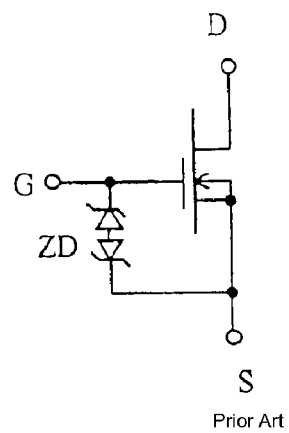
FIG. 7D shows an equivalent circuit of the conventional semiconductor device.
Figure 8:
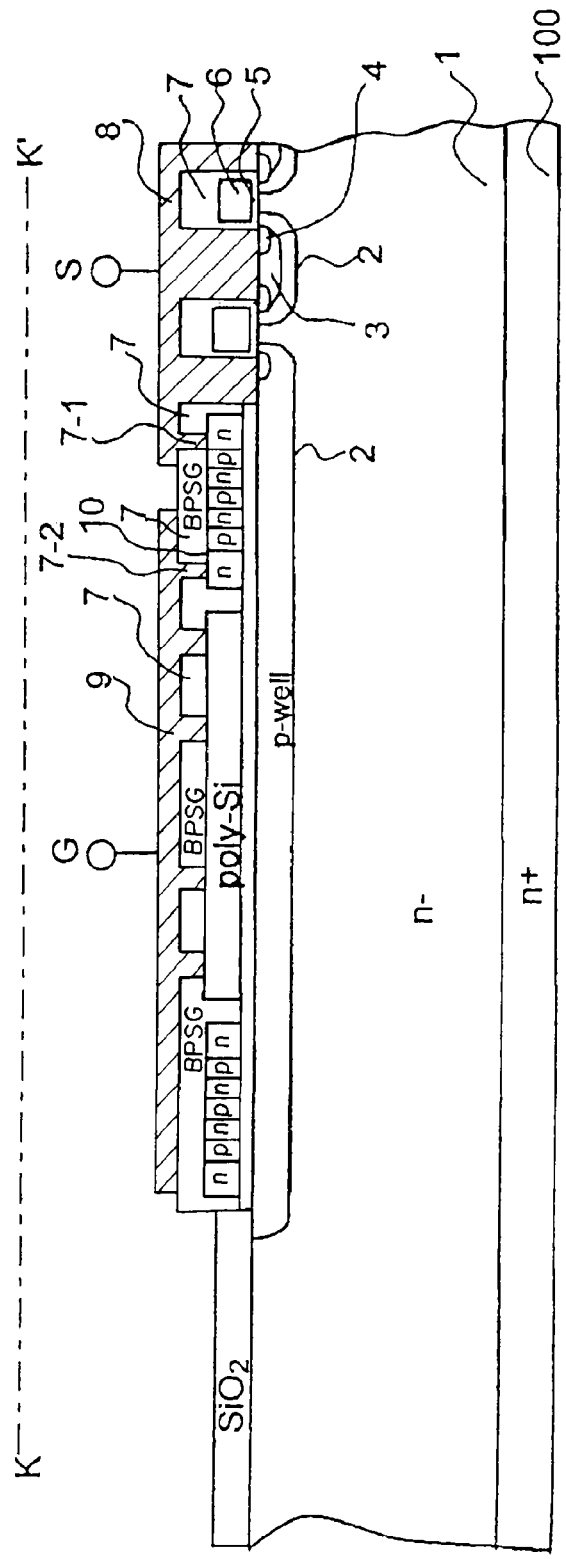
FIG. 8 is an enlarged sectional view taken along line K-K' in FIG. 7B.

FIG. 4A is an enlarged plan view of a portion including plural Zener diodes that are formed outside the gate metal electrode pad 9 utilizing the striped polysilicon layers formed in arbitrary portions of the active region 15, in addition to the Zener diodes 10 shown in FIG. 3A. FIG. 4C is a sectional view taken along line C-C' in FIG. 4A. As shown in FIG. 4C, plural Zener diodes are formed in the gate region having the same cell structure as the active region 15 so as to be connected between the gate and the source with such wiring that they are connected to each other in parallel. In this manner, the necessary Zener diode area can be increased arbitrarily. FIG. 6 is a partially sectional perspective view taken along line E-E' and F-F' in FIG. 4A. The sectional structure along line E-E' is the same as that along line F-F''. FIG. 6 shows that the interlayer insulating film (BPSG film) 7 (not shown in FIG. 4A) is sandwiched between the Zener diodes 10 and the gate metal electrode pad 9 or the source metal electrode 8. The metal electrodes 8 and 9 are brought in contact with the Zener diodes 10 by forming contact openings (not shown in FIG. 6) through the interlayer insulating film 7.

Figure 4B:
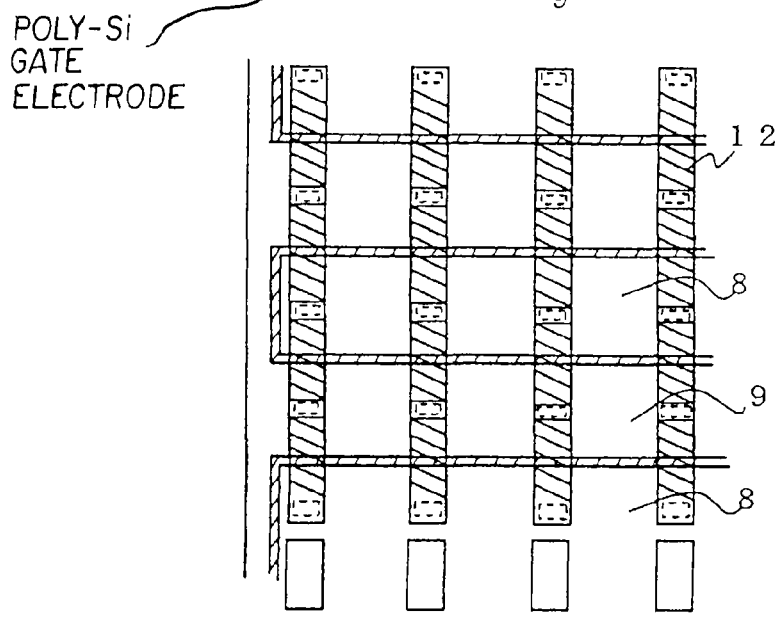
Figure 4C:
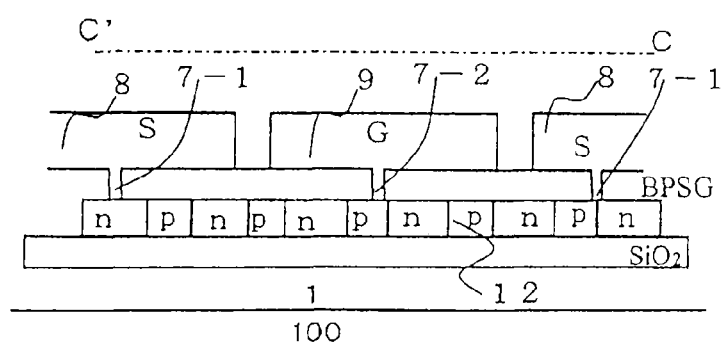
FIG. 4C is a sectional view taken along line C-C' in FIG. 4A.

FIG. 4B shows a modification of the MOS semiconductor device of FIG. 4A. As in the MOS semiconductor device of FIG. 4A, Zener diodes are formed in striped polysilicon layers having the same cell structure as in the active region 15 so as to be connected to each other in parallel. The MOS semiconductor device of FIG. 4B is different from that of FIG. 4A in that the pn junctions 12 are formed obliquely from, rather than perpendicularly to, the longitudinal direction of the polysilicon layers. This increases the area of the pn junctions 12 and hence increases the ESD capability further.

Figure 5:
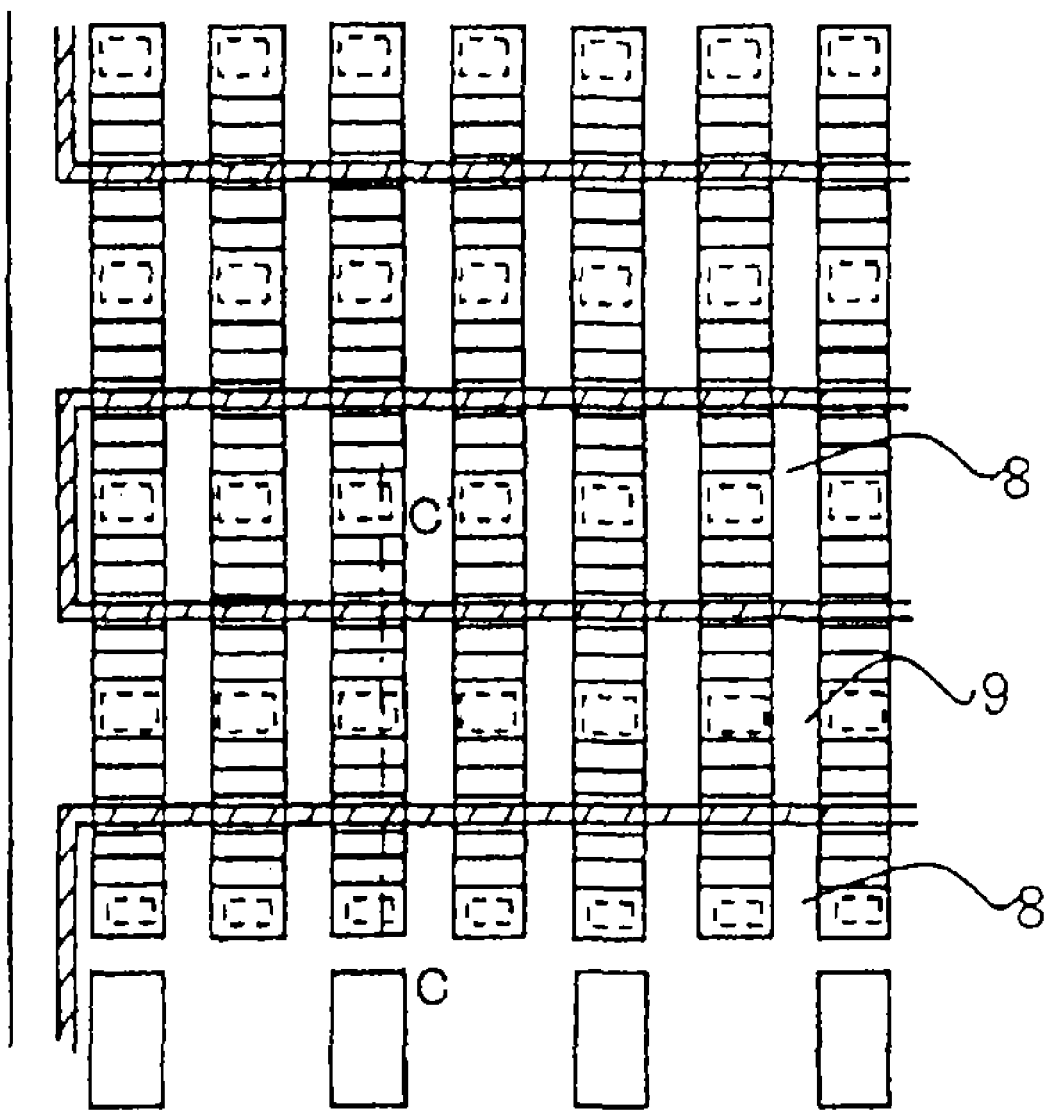
FIG. 5 is an enlarged plan view showing another example of Zener diodes in the active region of the semiconductor device according to the second embodiment.

FIG. 5 shows another modification of the MOS semiconductor device of FIG. 4A. As in the MOS semiconductor device of FIG. 4A, Zener diodes are formed in striped polysilicon layers having the same cell structure as in the active region 15 so as to be connected to each other in parallel. The MOS semiconductor device of FIG. 5 is different from that of FIG. 4A in that the number of striped polysilicon layers is larger than in the MOS semiconductor device of FIG. 4A. That is, Zener diodes are also formed (connected to each other in parallel) in striped polysilicon layers that are formed at the positions corresponding to the middle positions between the gate electrodes made of striped polysilicon. This increases the Zener diode area and hence further increases the ESD capability.

Figure 9:
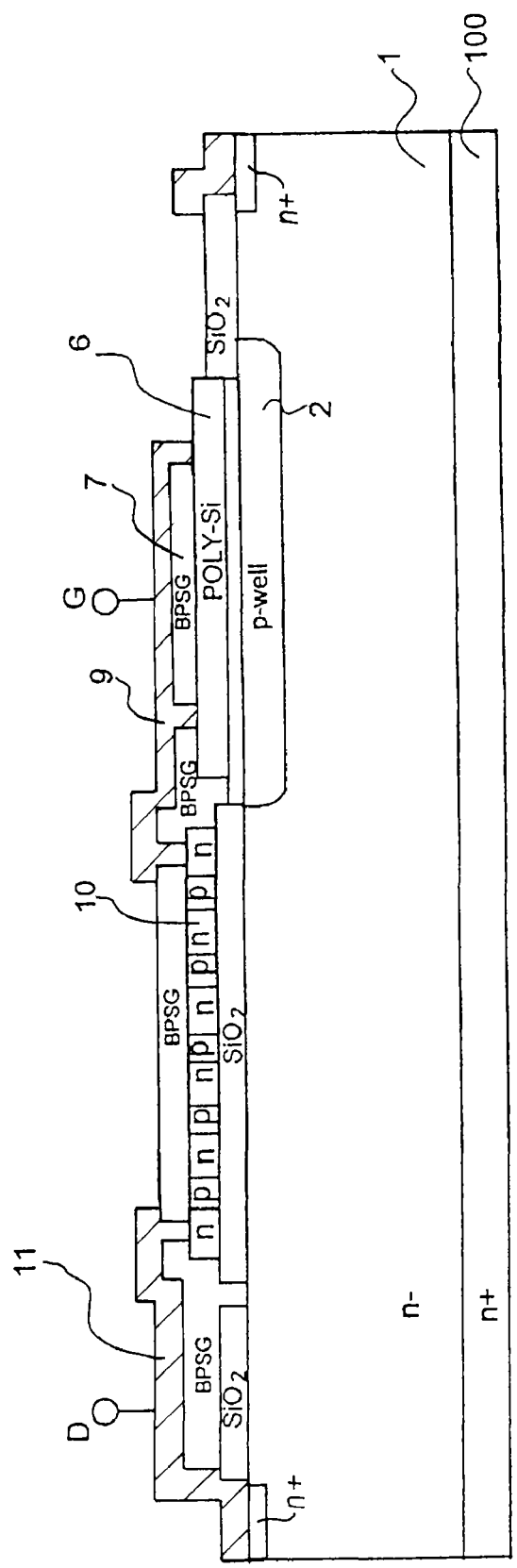
FIG. 9 is an enlarged sectional view of a semiconductor device according to the invention in which Zener diodes are connected between the gate and the drain.

FIG. 9 is a sectional view of a MOS semiconductor device in which multi-stage pn junctions are formed in each of striped polysilicon layers in such a manner that the Zener diode 10 is connected between the gate and the drain.

As described above, the invention makes it possible to form more Zener diodes in the gate pad region and to add a gate resistor by setting contact positions properly. The invention can thus makes it possible to make the ESD capability higher than in the conventional device in which a Zener diode is formed along the outer circumference of a gate pad. Where it is necessary to form Zener diodes for protection or sensing in an area other than the gate pad region in addition to Zener diodes for increase of the ESD capability, conventionally it is necessary to redesign a chip from the start because the Zener diode region and the active region have different surface structures and hence an ineffective area for isolation is necessary. According to the invention, Zener diodes have the same structure as in the cells in the active region. Therefore, Zener diodes can be formed through partial modification of a chip design instead of redesigning it from the first. Furthermore, since polysilicon layers where to form Zener diodes are the same in structure as those for gate electrodes in the active region, it is not necessary to form any additional regions that do not contribute to the active region. This makes it possible to prevent increase of the on-resistance.

The invention has been described with reference to certain preferred embodiments thereof. It will be understood, however, that modifications and variations are possible within the scope of the appended claims.

This application is based on, and claims priority to, Japanese Patent Application No: 2007-207562, filed on Aug. 9, 2007. The disclosure of the priority application, in its entirety, including the drawings, claims, and the specification thereof, is incorporated herein by reference.

What is claimed is:

1. A semiconductor device comprising:
   an active region as a main operation region;
   a main electrode film provided on a surface of the active region;
   a gate metal electrode pad that is formed on a surface of a rectangular polysilicon layer provided outside the active region;
   a multi-stage Zener diode formed in the polysilicon layer in such a manner that multiple stages of p-type layers and n-type layers are alternately formed;
   wherein the gate metal electrode pad is formed on the Zener diode with an insulating film interposed in between, one contact region of the Zener diode is electrically connected to the gate metal electrode pad and another contact region is electrically connected to the main electrode film;
   wherein the gate metal electrode pad and the main electrode film are electrically connected to the two contact regions of the rectangular Zener diode through contact holes that are formed selectively through the insulating film, at least one pair of contact holes corresponding to the two contact regions are separated from each other in a direction parallel with pn junctions, and the gate metal electrode pad and the main electrode film are isolated from each other between at least the one pair of contact holes.

2. A semiconductor device as claimed in claim 1, further comprising gate electrodes for controlling a main current flowing through the active region provided on a first major surface of a semiconductor substrate, wherein the gate electrodes extend from plural striped gate electrode polysilicon layers provided on surfaces in the active region, with an insulating film interposed in between, and are connected together to gate metal electrode pad.

3. A semiconductor device as claimed in claim 1, wherein the main electrode film comprises a source electrode.

4. A semiconductor device as claimed in claim 1, wherein the main electrode film comprises a drain electrode.

5. A semiconductor device as claimed in claim 1, wherein the polysilicon layer is substantially rectangular.

6. A semiconductor device as claimed in claim 1, wherein the Zener diode is substantially rectangular.

7. A semiconductor device as claimed in claim 1, wherein a breakdown voltage is adjustable by selecting the locations of the contact regions to alter the number of stages provided in the Zener diode.

8. The semiconductor device according to claim 1, wherein plural multi-stage Zener diodes are formed in the polysilicon layer so as to be isolated from each other and connected to each other in parallel.

9. A semiconductor device comprising:
   an active region as a main operation region;
   a main electrode film provided on a surface of the active region;
   a gate metal electrode pad that is formed inside the active region so as to be electrically isolated from the active region;
   plural striped Zener diodes formed in plural respective striped polysilicon layers that are electrically isolated from the plural striped gate electrode polysilicon layers and in each of which p-type layers and n-type layers are formed alternately in multiple stages in a direction that crosses a longitudinal direction of the plural striped polysilicon layers and are connected to each other in series; and an insulating film which covers surfaces of the striped Zener diodes;

wherein one contact region of each of the striped Zener diodes is electrically connected to the gate metal electrode pad and another contact region of each of the striped Zener diodes is electrically connected to the main electrode film, and the plural striped Zener diodes are connected to each other in parallel.

10. A semiconductor device as claimed in claim 9, further comprising gate electrodes for controlling a main current flowing through the active region provided on a first major surface of a semiconductor substrate, wherein the gate electrodes extend from plural striped gate electrode polysilicon layers provided on surfaces in the active region with an insulating film interposed in between and are connected together to the gate metal electrode pad.

11. The semiconductor device according to claim 9, wherein the gate metal electrode pad is formed on the surfaces of the plural striped Zener diodes inside the active region with the insulating film interposed in between.

12. The semiconductor device according to claim 9, wherein the main electrode film comprises a source electrode.

13. The semiconductor device according to claim 9, wherein the main electrode film comprises a drain electrode.

* * * * *